United States Patent
Chun et al.

(10) Patent No.: US 11,513,162 B2
(45) Date of Patent: Nov. 29, 2022

(54) METHOD, APPARATUS, AND COMPUTER PROGRAM FOR DIAGNOSING INTERNAL SHORT CIRCUIT OF BATTERY PACK

(71) Applicant: Samsung SDI Co., Ltd., Yongin-si (KR)

(72) Inventors: Changyoon Chun, Yongin-si (KR); Subin Song, Yongin-si (KR); Taekyung Lee, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 169 days.

(21) Appl. No.: 16/548,627

(22) Filed: Aug. 22, 2019

(65) Prior Publication Data
US 2020/0072912 A1 Mar. 5, 2020

(30) Foreign Application Priority Data
Aug. 28, 2018 (KR) .................. 10-2018-0101560

(51) Int. Cl.
*G01R 31/396* (2019.01)
*G01R 31/382* (2019.01)

(52) U.S. Cl.
CPC .......... *G01R 31/396* (2019.01); *G01R 31/382* (2019.01)

(58) Field of Classification Search
CPC .. G01R 31/389; G01R 31/382; G01R 31/396; G01R 31/392; H01M 10/48; H01M 10/44; H02J 7/0047; H02J 7/0014; H02M 3/04; Y02T 10/70; Y02E 60/10
USPC .......... 324/400, 430, 433, 500, 600, 764.01, 324/103 R, 771, 761.01, 501, 639, 642, 324/702, 76.11, 76.66, 96
See application file for complete search history.

(56) References Cited

U.S. PATENT DOCUMENTS 5,945,805 A 8/1999 Takei et al.
8,643,332 B2 2/2014 Yokotani
(Continued)

FOREIGN PATENT DOCUMENTS

KR        1998-0003629 A    3/1998
KR   10-2010-0050514 A    5/2010
KR      10-1568184 B1   11/2015

OTHER PUBLICATIONS

Finegan, Donal P. et al., "Characterising thermal runaway within lithium-ion cells be introducing and monitoring internal short circuits", Energy & Environmental Science, Jun. 2017, pp. 1377-1388, vol. 10, No. 6, The Royal Society of Chemistry.
(Continued)

*Primary Examiner* — Patrick Assouad
*Assistant Examiner* — Trung Q Nguyen
(74) *Attorney, Agent, or Firm* — Lewis Roca Rothgerber Christie LLP (57) ABSTRACT

Provided is a method, apparatus, and computer program for diagnosing an internal short circuit of a battery pack. The method may be for diagnosing an internal short circuit of a battery pack based on a state of charge (SOC) variation amount and a balancing amount of each cell of the battery pack, and the method may include checking an SOC variation amount of the battery pack when the battery pack is in a first state, checking a balancing amount of the battery pack when the battery pack is in a second state, and determining whether the battery pack has an internal short circuit based on the checked SOC variation amount and the checked balancing amount.

17 Claims, 5 Drawing Sheets

(56) References Cited

U.S. PATENT DOCUMENTS

| | | |
|---|---|---|
| 9,097,774 B2 | 8/2015 | White et al. |
| 2008/0074082 A1 | 3/2008 | Tae et al. |
| 2010/0134070 A1 | 6/2010 | Yun et al. |
| 2010/0188054 A1 | 7/2010 | Asakura et al. |
| 2012/0175953 A1* | 7/2012 | Ohkawa ................ B60L 58/14 307/18 |
| 2016/0241058 A1* | 8/2016 | Carralero ............... H02J 7/007 |
| 2016/0329725 A1* | 11/2016 | Butzmann ............... H02J 7/007 |
| 2017/0074918 A1 | 3/2017 | Stewart et al. |
| 2019/0181653 A1* | 6/2019 | Wu ........................ B60L 58/21 |

OTHER PUBLICATIONS

Guo, Rui et al., "Mechanism of the entire overdischarge process and overdischarge-induced internal short circuit in lithium-ion batteries", Scientific Reports, Jul. 22, 2016, pp. 1-9, www.nature.com/scientificreports.

Wu, Hui et al., "Improving battery safety by early detection of internal shorting with a bifunctional separator", Nature Communications, Oct. 13, 2014, pp. 1-6, Macmillan Publishers Limited.

\* cited by examiner

METHOD, APPARATUS, AND COMPUTER PROGRAM FOR DIAGNOSING INTERNAL SHORT CIRCUIT OF BATTERY PACK

CROSS-REFERENCE TO RELATED APPLICATION

This application claims priority to, and the benefit of, Korean Patent Application No. 10-2018-0101560, filed on Aug. 28, 2018, in the Korean Intellectual Property Office, the disclosure of which is incorporated herein in its entirety by reference.

BACKGROUND

1. Field

One or more embodiments relates to a method, apparatus, and computer program for diagnosing an internal short circuit of a battery pack (e.g., based on a state of charge (SOC) variation amount and a balancing amount of each cell of the battery pack).

2. Description of Related Art

In recent times, technology relating to battery packs has been developed along with the development of technology relating to electric vehicles, energy storage devices, etc. For example, there is a trend toward developing technology for sensing the states of battery packs for charging, discharging, and managing the battery packs.

In the related art, methods of detecting the variation patterns of voltage and/or current and the efficiency of charge and discharge operations have been proposed to check a short circuit in a battery pack. However, these methods are suitable only for small battery packs and/or cells that are sensitive to voltage, current, and temperature because of a small capacity relative to equivalent resistance, but are not suitable as methods of checking an internal short circuit of a high-capacity battery pack.

SUMMARY

According to one or more embodiments, an internal short circuit of a battery pack including a plurality of cells may be more accurately determined.

According to one or more embodiments, whether a battery pack has an internal short circuit may be determined by considering both a rest state and an operation state of the battery pack, and the determination may be more reliably performed by considering a time period of each state.

Additional aspects will be set forth in part in the description which follows and, in part, will be apparent from the description, or may be learned by practice of the presented embodiments of the disclosure.

According to one or more embodiments, there is provided a method of diagnosing an internal short circuit of a battery pack based on a state of charge (SOC) variation amount and a balancing amount of each cell of the battery pack, the method including checking an SOC variation amount of the battery pack when the battery pack is in a first state, checking a balancing amount of the battery pack when the battery pack is in a second state, and determining whether the battery pack has an internal short circuit based on the checked SOC variation amount and the checked balancing amount.

The first state may correspond to a rest state of the battery pack.

The checking of the SOC variation amount of the battery pack may include selecting one cell from one or more cells in the battery pack, the one cell having a largest SOC variation amount when the battery pack is in the first state, and determining the SOC variation amount of the battery pack to correspond to the SOC variation amount of the selected cell.

The SOC variation amount of the battery pack may correspond to a difference between the SOC variation amount of the selected cell and an average of SOC variation amounts of the one or more cells.

The second state may correspond to an operation state of the battery pack.

The checking of the balancing amount of the battery pack may include selecting one cell from at least two cells in the battery pack, the one cell having a smallest balancing amount when the battery pack is in the second state, and determining the balancing amount of the battery pack to correspond to the balancing amount of the selected cell.

The balancing amount of the battery pack may correspond to a difference between the balancing amount of the selected cell and an average of balancing amounts of the at least two cells.

The checking of the balancing amount of the battery pack may include selecting one cell from at least two cells in the battery pack, the one cell having a largest balancing amount when the battery pack is in the second state, and determining the balancing amount of the battery pack to correspond to the balancing amount of the selected cell.

The method may further include, prior to the determining of whether the battery pack has an internal short circuit, calculating a first time period, which is a sum of all time periods during which the battery pack is in the first state, and a second time period, which is a sum of all time periods during which the battery pack is in the second state.

The method may further include determining the battery pack as having an internal short circuit when a sum of a first value obtained by multiplying the checked SOC variation amount by the first time period and a second value obtained by multiplying the checked balancing amount by the second time period is greater than a threshold value.

A computer program stored on a non-transitory medium may execute, using a computer, the method of diagnosing an internal short circuit of a battery pack based on a state of charge (SOC) variation amount and a balancing amount of each cell of the battery pack.

According to one or more embodiments, there is provided an apparatus for diagnosing an internal short circuit of a battery pack based on an SOC variation amount and a balancing amount of each cell of the battery pack, the apparatus including a controller that is configured to check an SOC variation amount of the battery pack when the battery pack is in a first state, check a balancing amount of the battery pack when the battery pack is in a second state, and determine, based on the checked SOC variation amount and the checked balancing amount, whether the battery pack has an internal short circuit.

The first state may correspond to a rest state of the battery pack, and the controller may be further configured to select one cell from one or more cells in the battery pack, the one cell having a largest SOC variation amount when the battery pack is in the first state, and determine the SOC variation amount of the battery pack to correspond to the SOC variation amount of the selected cell.

The controller may be further configured to determine the SOC variation amount of the battery pack to correspond to a difference between the SOC variation amount of the selected cell and an average of SOC variation amounts of the one or more cells.

The second state may correspond to an operation state of the battery pack, and the controller may be further configured to select one cell from at least two cells in the battery pack, the one cell having a smallest balancing amount when the battery pack is in the second state, and determine the balancing amount of the battery pack to correspond to the balancing amount of the selected cell.

The controller may be further configured to determine the balancing amount of the battery pack to correspond to a difference between the balancing amount of the selected cell and an average of balancing amounts of the at least two cells.

The second state may correspond to an operation state of the battery pack, and The controller may be further configured to select one cell from at least two cells in the battery pack, the one cell having a largest balancing amount when the battery pack is in the second state, and determine the balancing amount of the battery pack to correspond to the balancing amount of the selected cell.

The controller may be further configured to calculate a first time period, which is a sum of all time periods during which the battery pack is in the first state, and a second time period, which is a sum of all time periods during which the battery pack is in the second state.

The controller may be further configured to determine that the battery pack has an internal short circuit when a sum of a first value obtained by multiplying the checked SOC variation amount by the first time period and a second value obtained by multiplying the checked balancing amount by the second time period is greater than a threshold value.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
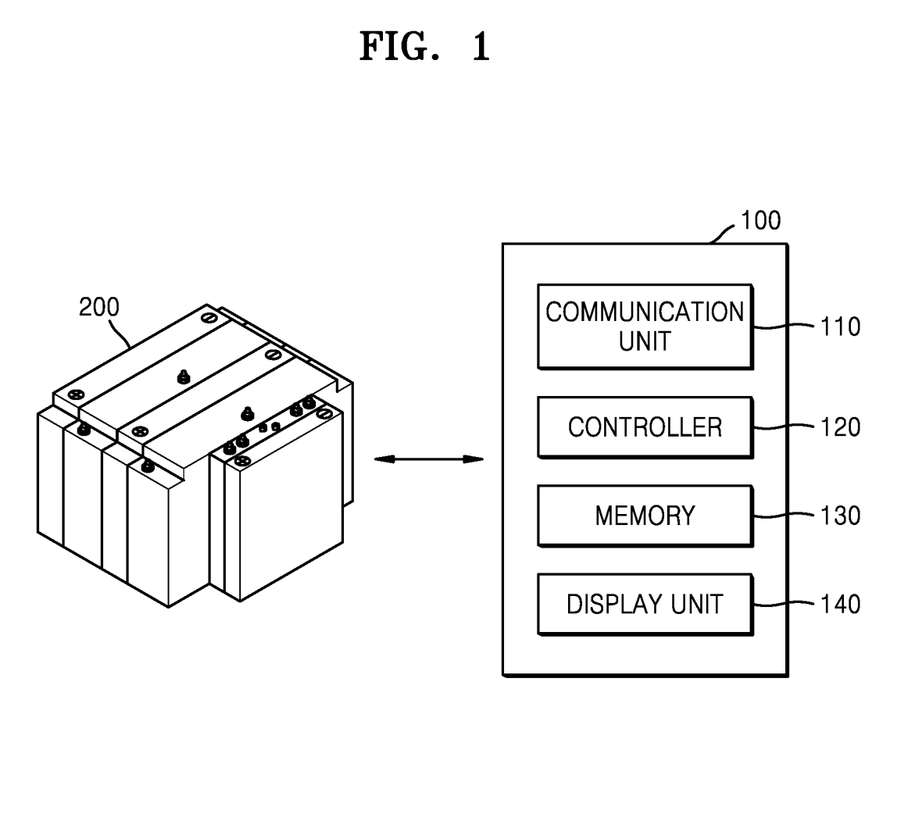
FIG. 1 is a view illustrating a structure of a system for diagnosing an internal short circuit of a battery pack, according to an embodiment.

FIG. 1 is a view illustrating a structure of a system for diagnosing an internal short circuit of a battery pack 200 according to an embodiment.

As shown in FIG. 1, the system according to the present embodiment may include a battery-pack-internal-short-circuit-diagnosis apparatus 100 and a battery pack 200 to be diagnosed.

According to the present embodiment, the battery-pack-internal-short-circuit-diagnosis apparatus 100 may determine whether the battery pack 200 has an internal short circuit by checking the state of charge (SOC) variation amount of the battery pack 200 when the battery pack 200 is in a first state, and by checking the balancing amount of the battery pack 200 when the battery pack 200 is in a second state. To this end, the battery-pack-internal-short-circuit-diagnosis apparatus 100 of the present embodiment may include a communication unit/communicator 110, a controller 120, a memory 130, and a display unit/display 140.

According to the present embodiment, the communicator 110 may establish a communication connection between the battery-pack-internal-short-circuit-diagnosis apparatus 100 and other devices, and may transmit and receive data through the communication connection.

For example, the communicator 110 may transmit information about a battery internal short circuit to a user terminal that manages the battery pack 200, and may receive a corresponding input from a user. In addition, the communicator 110 may transmit and receive data to and from the battery pack 200.

In addition, the communicator 110 may transmit and receive data to and from various devices (for example, the user terminal or the battery pack 200) according to various communication methods. For example, the communicator 110 may transmit and receive data to and from various devices using any one of a BLUETOOTH™ communication method, a Wi-Fi communication method, a ZIGBEE™ communication method, and a near-field communication (NFC) communication method. In addition, the communicator 110 may transmit and receive data to and from various devices using any one of a controller area network (CAN) communication method, an RS485 communication method, an RS232 communication method, and an RS422 communication method. However, the communication methods described above are examples, and any method for transmitting data between two devices may be used without limitations.

The controller 120 of the present embodiment may receive various information from the battery pack 200, and may diagnose an internal short circuit of the battery pack 200 based on the received information. For example, the controller 120 may receive, from the battery pack 200, information about the SOC variation amount of the battery pack 200 when the battery pack 200 is in the first state. In this case, the controller 120 may receive the SOC variation amount of each of a plurality of cells included in the battery pack 200, and may receive the sum of all time periods during which the battery pack 200 is in the first state. The operation of the controller 120 will be described below.

The controller 120 may include any kind of device capable of processing data, such as a processor. Here, the "processor" may refer to a data processing device included in hardware and having a physically structured circuit to execute codes of programs or functions expressed with instructions. Examples of the data processing device included in hardware may include a microprocessor, a central processing unit (CPU), a processor core, a multiprocessor, an application-specific integrated circuit (ASIC), and a field programmable gate array (FPGA), but the scope of the present disclosure is not limited thereto.

The memory 130 of the present embodiment may temporarily or permanently store data, instructions, programs, program codes, or combinations thereof that the controller 120 processes. Examples of the memory 130 may include a random access memory (RAM), a read only memory (ROM), and a permanent mass storage device, such as a disk drive. In addition, the memory 130 may include a magnetic storage medium or a flash storage medium, but the scope of the present disclosure is not limited thereto.

Under the control of the controller, the display 140 of the present embodiment may display information, such as an internal short circuit of the battery pack 200 and/or an operation state of the battery-pack-internal-short-circuit-diagnosis apparatus 100.

In this case, the display 140 may include a display device configured to display such information using characters or graphics. The display device may include any one of a cathode ray tube (CRT), a liquid crystal display (LCD), a plasma display panel (PDP), and an organic light emitting diode (OLED).

In addition, the display 140 may include a display device configured to display such information using colors, the frequency of blinking, and/or the number of blinks. For example, the display device may include a plurality of light emitting diodes (LEDs), and whether the battery pack 200 has an internal short circuit may be displayed on the display device by a given frequency of blinking. However, this is an example, and the idea of the present disclosure is not limited thereto.

Information displayed by the display 140 may be generated by the controller 120 of the battery-pack-internal-short-circuit-diagnosis apparatus 100, or may be acquired by the controller 120 from the battery pack 200 or from the user terminal.

In some embodiments, the display 140 of the battery-pack-internal-short-circuit-diagnosis apparatus 100 may be omitted. In this case, information about an internal short circuit of the battery pack 200 may be displayed on a user terminal or the like.

In other embodiments, the battery-pack-internal-short-circuit-diagnosis apparatus 100 may include a port for a wired connection with the battery pack 200. In this case, the battery-pack-internal-short-circuit-diagnosis apparatus 100 may receive power from the battery pack 200 through the port. Alternatively, the battery-pack-internal-short-circuit-diagnosis apparatus 100 may be connected to a power source separate from the battery pack 200.

According to another embodiment, the battery-pack-internal-short-circuit-diagnosis apparatus 100 may be an apparatus included in the battery pack 200. In other words, a battery-pack-internal-short-circuit-diagnosis method may be performed by components included in the battery pack 200, according to an embodiment. For example, a battery-pack-internal-short-circuit-diagnosis method may be performed by a micro control unit (MCU) and/or a battery management system (BMS) included in the battery pack 200 according to an embodiment. However, for ease of description, the following description will be given based with respect to the case in which the battery-pack-internal-short-circuit-diagnosis apparatus 100 is separately provided, as shown in FIG. 1.

The battery pack 200 of the present embodiment is an object to be diagnosed by the battery-pack-internal-short-circuit-diagnosis apparatus 100, and may include at least one chargeable and dischargeable cell. In this case, examples of the at least one cell may include a lithium-ion battery cell, a lithium polymer battery cell, or the like, but the present embodiment is not limited thereto.

The at least one cell, that is, one or more cells, may be connected in series to each other. The number of cells included in the battery pack 200 may be determined according to a suitable output voltage and a suitable electricity storage capacity.

The battery pack 200 of the present embodiment may include a BMS to manage the at least one cell. In this case, the BMS may check the state of at least one cell, and may transmit the checked state to the battery-pack-internal-short-circuit-diagnosis apparatus 100. For example, the BMS may check the state of at least one cell, such as the current, voltage, temperature, remaining electricity, lifespan, or SOC of the at least one cell, and may transmit results thereof to the battery-pack-internal-short-circuit-diagnosis apparatus 100.

According to another embodiment, the BMS may perform a battery-pack-internal-short-circuit-diagnosis method (described below). In this case, the battery-pack-internal-short-circuit-diagnosis apparatus 100 may not be separately provided.

The following description will be given mainly for the case in which the controller 120 of the battery-pack-internal-short-circuit-diagnosis apparatus 100 of the present embodiment performs a method of diagnosing an internal short circuit of the battery pack 200 based on the SOC variation amount and the balancing amount of each cell of the battery pack 200.

The controller 120 of the present embodiment may check the SOC variation amount of the battery pack 200 when the battery pack 200 is in the first state.

In the present disclosure, the "first state" may correspond to a rest state of the battery pack 200. For example, the first state may refer to a state in which the battery pack 200 is neither being charged nor discharging. Furthermore, in the present disclosure, the "second state" may correspond to an operation state of the battery pack 200. For example, the second state may refer to a state in which the battery pack 200 is being charged or is discharging. As described above, in the present disclosure, the first state and the second state may be opposite states.

In the present disclosure, the term "SOC variation amount" may refer to the degree of increase or decrease of SOC during a given period of time. For example, the amount of SOC variation may refer to the difference between an SOC value at a first time point and an SOC value at a second time point. In this case, the second time point may be later than the first time point. The amount of SOC variation and/or an SOC value at each time point may be checked by the BMS of the battery pack 200. In addition, the amount of SOC variation and an SOC value at each time point, which are checked by the BMS, may be transmitted to the battery-pack-internal-short-circuit-diagnosis apparatus 100.

The controller 120 of the present embodiment may extract/select one of the cells of the battery pack 200 that has the largest SOC variation amount when the battery pack 200 is in the first state. In other words, the controller 120 may select a cell that has the largest SOC variation amount when the battery pack 200 is in a rest state.

In addition, when only one cell is included in the battery pack 200, the controller 120 of the present embodiment may select the cell as a cell having the largest SOC variation amount.

Next, the controller 120 of the present embodiment may determine the SOC variation amount of the battery pack 200 to correspond to the SOC variation amount of the selected cell.

In some embodiments, the controller 120 of the present embodiment may determine the SOC variation amount of the battery pack 200 to correspond to the difference between the SOC variation amount of the selected cell and the average of the SOC variation amounts of the cells included in the battery pack 200.

As described above, the controller 120 of the present embodiment may determine the SOC variation amount of the battery pack 200 and/or the SOC variation amounts of the cells of the battery pack 200 by using various methods.

Figure 2:
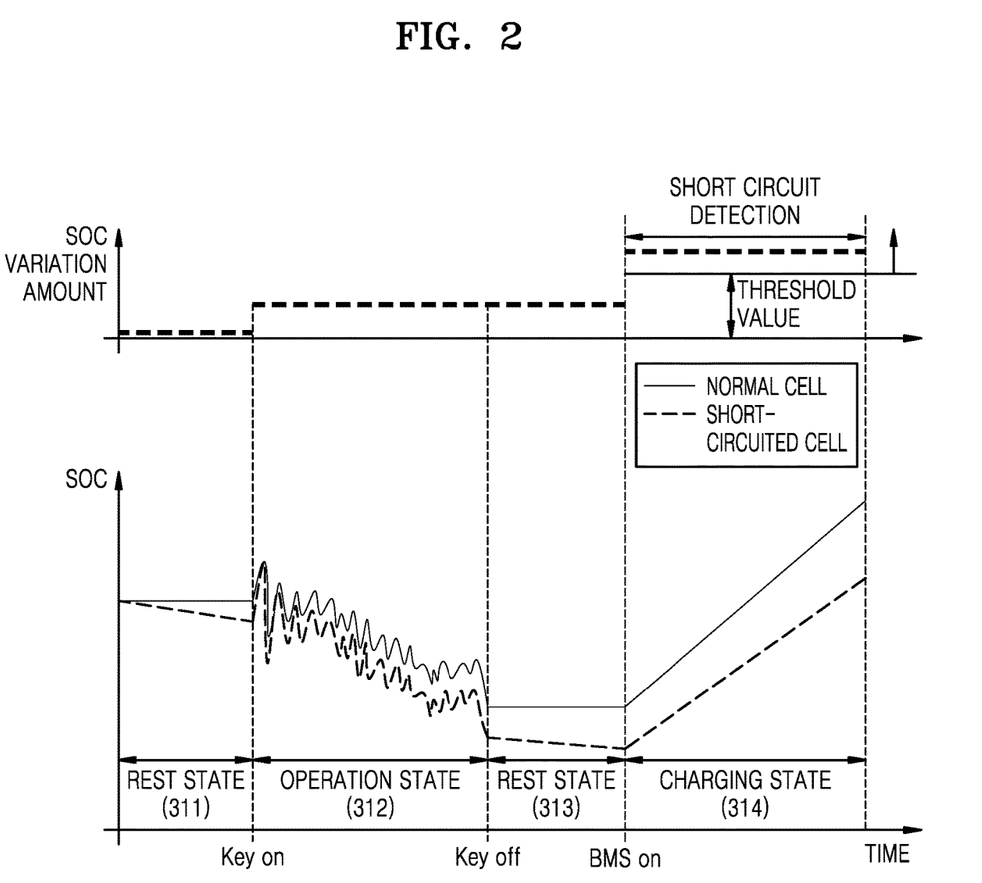
FIG. 2 is a view illustrating a method of determining an amount of variation in a state of charge (SOC) by using a controller, according to an embodiment.

FIG. 2 is a view illustrating a method of determining the amount of SOC variation by the controller 120 according to an embodiment.

As described above, the controller 120 of the present embodiment may check the SOC variation amount of the battery pack 200 when the battery pack 200 is in the first state, and the first state may correspond to first and second rest states 311 and 313 of the battery pack 200. In this case, the term "rest state" may refer to a state in which the battery pack 200 is neither being charged nor discharging.

In addition, the controller 120 of the present embodiment may select one of the cells of the battery pack 200 that has the largest SOC variation amount when the battery pack 200 is in the first state, and then the controller 120 may determine the SOC variation amount of the battery pack 200 to correspond to the SOC variation amount of the selected cell. In FIG. 2, the selected cell is indicated as a "short circuited cell," and the other cell is indicated as a normal cell.

The controller 120 of the present embodiment may check the sum of the SOC variation amount of the battery pack 200 in the first rest state 311 and the SOC variation amount of the battery pack 200 in the second rest state 313. In other words, the controller 120 of the present embodiment may accumulatively check the SOC variation amount of the battery pack 200 in the first state.

An accumulated SOC variation amount may be used to check whether the battery pack 200 and/or a corresponding cell have an internal short circuit, and this will be described below.

In addition, as described above, the amount of SOC variation may refer to the difference between an SOC value at a first time point and an SOC value at a second time point, and thus the amount of SOC variation may be updated at the end of a rest state by the controller 120.

For example, the controller 120 may update the amount of SOC variation at the end (e.g., a key-on time point) of the first rest state 311. In addition, the controller 120 may also update the amount of SOC variation at the end (e.g., a BMS-on time point) of the second rest state 313. However, this is an example, and depending on the design, the amount of SOC variation may be updated in real time or at different time points.

Figure 3:
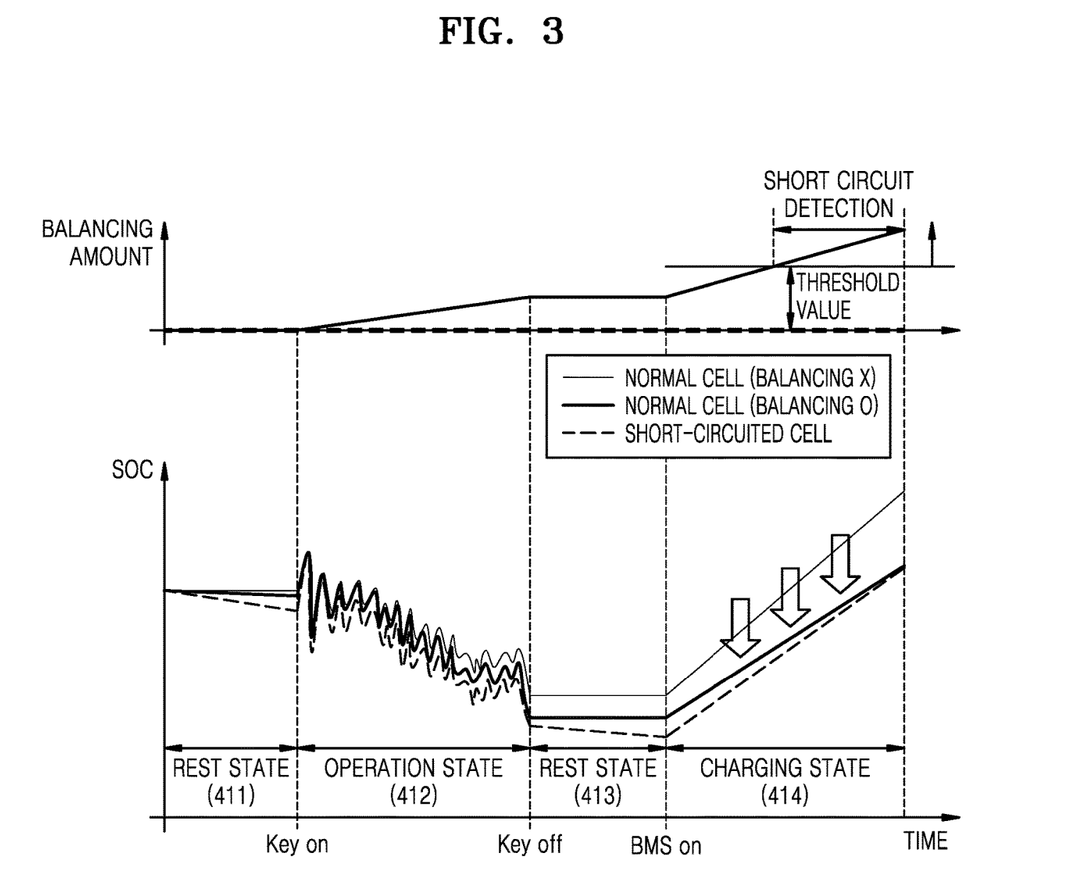
FIG. 3 is a view illustrating a method of determining an amount of balancing by using the controller, according to an embodiment.

The controller 120 of the present embodiment may check the balancing amount of the battery pack 200 when the battery pack 200 is in the second state.

As described above, in the present disclosure, the "second state" may correspond to an operation state of the battery pack 200. For example, the second state may refer to a state in which the battery pack 200 is being charged or is discharging. As described above, in the present disclosure, the first state and the second state may be opposite states.

In the present disclosure, the "balancing amount" may refer to the degree of balancing that is performed for a given period of time. The balancing amount may be proportional to, for example, the period of time during which balancing is performed. In addition, the balancing amount may also be proportional to the amount of charge that the battery pack 200 and/or the cells of the battery pack 200 have consumed for balancing. However, the above-mentioned "time period" and "charge amount" are examples of criteria for determining the amount of balancing, and the present disclosure is not limited thereto. The amount of balancing may be checked by the BMS of the battery pack 200, and may be transmitted to the battery-pack-internal-short-circuit-diagnosis apparatus 100.

The controller 120 of the present embodiment may select one cell, which has the smallest balancing amount, from at least two cells included in the battery pack 200 when the battery pack 200 is in the second state. In addition, the controller 120 may determine the balancing amount of the battery pack 200 to correspond to the balancing amount of the selected cell.

Conversely, the controller 120 of the present embodiment may select one cell, which has the largest balancing amount, from at least two cells included in the battery pack 200 when the battery pack 200 is in the second state. In addition, the controller 120 may determine the balancing amount of the battery pack 200 to correspond to the balancing amount of the selected cell.

The controller 120 of the present embodiment may determine the balancing amount of the battery pack 200 to correspond to the difference between the balancing amount of the selected cell and the average of the balancing amounts of the at least two cells.

As described above, the controller 120 of the present embodiment may determine the balancing amount of the battery pack 200 and/or the balancing amounts of the cells of the battery pack 200 by using various methods.

FIG. 3 is a view illustrating a method of determining a balancing amount by the controller 120 according to an embodiment.

As described above, the controller 120 of the present embodiment may check the balancing amount of the battery pack 200 when the battery pack 200 is in the second state, and the second state may correspond to an operation state 412 and/or a charging state 414 of the battery pack 200.

In addition, the controller 120 of the present embodiment may select one of the battery pack 200, which has the smallest (or largest) balancing amount, from at least two cells of the battery pack 200 when the battery pack 200 is in the second state. Then the controller 120 may determine the balancing amount of the battery pack 200 to correspond to the balancing amount of the selected cell. In FIG. 3, the selected cell is indicated as a "short circuited cell," and the other cells are indicated as normal cells (e.g., "BALANCING O" or "BALANCING X").

The controller 120 of the present embodiment may check the sum of the balancing amount of the battery pack 200 in the operation state 412 and the balancing amount of the battery pack 200 in the charging state 414. In other words, the controller 120 of the present embodiment may accumulatively check the balancing amount of the battery pack 200 in the second state.

An accumulated balancing amount may be used to check whether the battery pack 200 and/or a corresponding cell have an internal short circuit, and this will be described below.

In addition, as described above, because the "amount of balancing" may be proportional to the period of time during which balancing is performed, the controller 120 may update the amount of balancing in real time over time. For example, in the operation state 412, the controller 120 may increase the amount of balancing over time. In addition, the controller 120 may increase the amount of balancing over time in the charging state 414. This may be based on the balancing amount of a cell selected by the controller 120 that is largest. However, this is an example, and the present disclosure is not limited thereto.

Based on the amount of SOC variation and the amount of balancing that have been checked through the above-described operations, the controller 120 of the present embodiment may determine whether the battery pack 200 has an internal short circuit.

Referring back to FIG. 2, when the amount of SOC variation that is accumulated for a given period of time is equal to or greater than a threshold value, the controller 120 of the present embodiment may determine that a corresponding cell and/or the battery pack 200 are internally short circuited. In other words, the controller 120 may determine that an internal short circuit has occurred in the corresponding cell and/or the battery pack 200 in a "short circuit detected period" in which the accumulated amount of SOC variation is equal to or greater than the threshold value.

Similarly, referring to FIG. 3, when the amount of balancing that is accumulated for a given period of time is equal to or greater than (or equal to or less than) a threshold value, the controller 120 of the present embodiment may determine that a corresponding cell and/or the battery pack 200 are internally short circuited. In other words, the controller 120 may determine that an internal short circuit has occurred in the corresponding cell and/or the battery pack 200 in a "short circuit detected period" in which the accumulated balancing amount is equal to or greater than (or equal to or less than) the threshold value.

In another embodiment, when the sum of a value obtained by multiplying a checked SOC variation amount by a first time period and a value obtained by multiplying a checked balancing amount by a second time period is greater than a threshold value, the controller 120 of the present embodiment may determine that the battery pack 200 has an internal short circuit. In this case, the first time period may refer to the sum of all time periods during which the battery pack 200 is in the first state, the second time period may refer to the sum of all time periods during which the battery pack 200 is in the second state, and the first time period and the second time period may be calculated by the controller 120.

Alternatively, when the sum of a first value, which is obtained by multiplying a checked SOC variation amount by the ratio of the first time period to the sum of the first and second time periods, and a second value, which is obtained by multiplying a checked balancing amount by the ratio of the second time period to the sum of the first and second time periods, is greater than a normalized threshold value, the controller 120 of the present embodiment may determine that the battery pack 200 has an internal short circuit. In this case, the first and second time periods are as described above.

As described above, according to the present disclosure, whether the battery pack 200 has an internal short circuit may be determined by considering both the rest state and the operation state of the battery pack 200, and the determination may be more reliably performed by considering the time period of each state.

In addition, according to the present disclosure, the occurrence of an internal short circuit may be more reliably determined by detecting the occurrence of abnormality in two different states by using methods respectively suitable for the two different states, and using results of the determination in a complementary manner.

The controller 120 of the present embodiment may perform the above-described operations repeatedly by initializing an accumulated SOC variation amount and an accumulated balancing amount at given time intervals. For example, at intervals of 3000 seconds, the controller 120 may accumulate the amount of SOC variation and the amount of balancing, and may respectively compare the accumulated SOC variation amount and the accumulated balancing amount with threshold values to determine whether the battery pack 200 has an internal short circuit. In this case, when it is determined that an abnormality has occurred, the controller 120 may take an action (for example, sounding an alarm or the like) according to the abnormality. In case of no abnormality, the controller 120 may initialize the accumulated SOC variation amount and the accumulated balancing amount (for example, initializing the amounts to zero), and may then repeat the above-described operations.

FIGS. 4, 5, 6A, and 6B are flowcharts illustrating a battery-pack-internal-short-circuit-diagnosis method that is performed by the controller 120 of the battery-pack-internal-short-circuit-diagnosis apparatus 100 according to an embodiment. Descriptions that are the same as those given with reference to FIGS. 1 to 3 will not be repeated here, and the battery-pack-internal-short-circuit-diagnosis method will now be described with reference to FIGS. 4, 5, 6A, and 6B.

Figure 4:
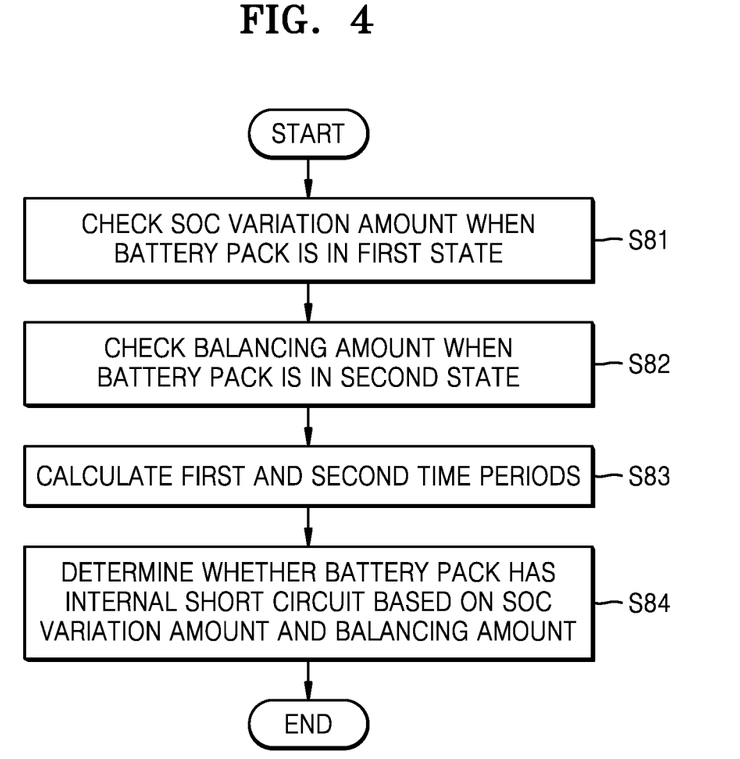
FIGS. 4, 5, 6A, and 6B are flowcharts illustrating a method of diagnosing an internal short circuit of a battery pack by using a battery-pack-internal-short-circuit-diagnosis apparatus, according to an embodiment.

According to the present embodiment, the controller 120 may check the SOC variation amount of the battery pack 200 when the battery pack 200 is in a first state (S81). As described above, in the present disclosure, the "first state" may correspond to a rest state of the battery pack 200. For example, the first state may refer to a state in which the battery pack 200 is neither being charged nor discharging. Furthermore, in the present disclosure, a "second state" may correspond to an operation state of the battery pack 200. For example, the second state may refer to a state in which the battery pack 200 is being charged or is discharging. As described above, in the present disclosure, the first state and the second state may be opposite states.

In the present disclosure, the term "SOC variation amount" may refer to the degree of increase or decrease of SOC during a given period of time. For example, the amount of SOC variation may refer to the difference between an SOC value at a first time point and an SOC value at the second time point. In this case, the second time point may be later than the first time point. The amount of SOC variation and/or an SOC value at each time point may be checked by the BMS of the battery pack 200. In addition, the amount of SOC variation and an SOC value at each time point, which are checked by the BMS, may be transmitted to the battery-pack-internal-short-circuit-diagnosis apparatus 100.

Figure 5:
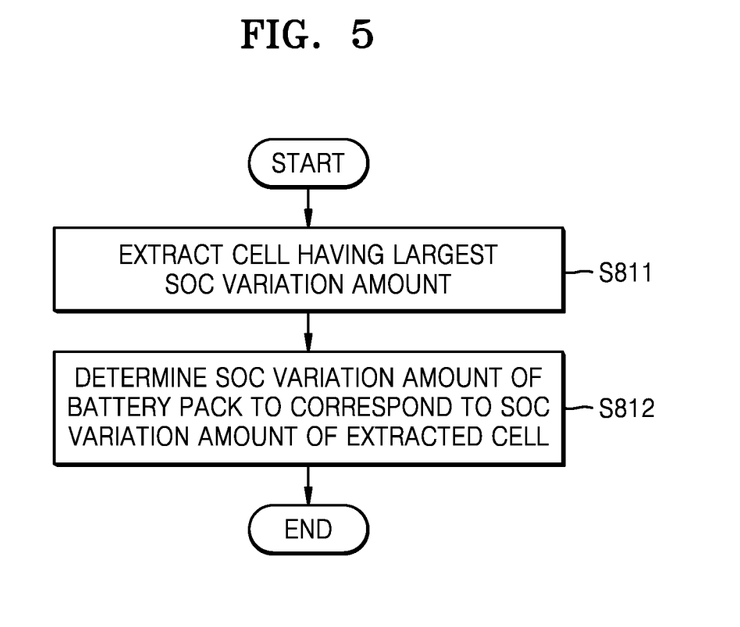

According to the present embodiment, the controller 120 may extract/select one of the cells of the battery pack 200 that has the largest SOC variation amount when the battery pack 200 is in the first state (S811). In other words, the controller 120 may select a cell that has the largest SOC variation amount when the battery pack 200 is in a rest state.

In addition, according to the present embodiment, when only one cell is included in the battery pack 200, the controller 120 may select the cell as a cell having the largest SOC variation amount.

Next, according to the present embodiment, the controller 120 may determine the SOC variation amount of the battery pack 200 to correspond to the SOC variation amount of the selected cell (S812).

In some embodiments, the controller 120 may determine the SOC variation amount of the battery pack 200 to correspond to the difference between the SOC variation amount of the selected cell and the average of the SOC variation amounts of the cells included in the battery pack 200.

As described above, according to the present embodiment, the controller 120 may determine the SOC variation amount of the battery pack 200 and/or the SOC variation amounts of the cells of the battery pack 200 by using various methods.

A method of determining an SOC variation amount by the controller 120 will now be described according to an embodiment while referring back to FIG. 2. As described above, according to the present embodiment, the controller 120 may check the SOC variation amount of the battery pack 200 when the battery pack 200 is in the first state, and the first state may correspond to the first and second rest states 311 and 313 of the battery pack 200. In this case, the term "rest state" may refer to a state in which the battery pack 200 is neither being charged nor discharging.

In addition, according to the present embodiment, the controller 120 may select one of the cells of the battery pack 200 that has the largest SOC variation amount when the battery pack 200 is in the first state, and then the controller 120 may determine the SOC variation amount of the battery pack 200 to correspond to the SOC variation amount of the selected cell. In FIG. 2, the selected cell is indicated as a "short circuited cell," and the other cell is indicated as a normal cell.

According to the present embodiment, the controller 120 may check the sum of the SOC variation amount of the battery pack 200 in the first rest state 311 and the SOC variation amount of the battery pack 200 in the second rest state 313. In other words, according to the present embodiment, the controller 120 may accumulatively check the SOC variation amount of the battery pack 200 in the first state.

An accumulated SOC variation amount may be used to check whether the battery pack 200 and/or a corresponding cell have an internal short circuit. In addition, as described above, the amount of SOC variation may refer to the difference between an SOC value at a first time point and an SOC value at a second time point, and thus the amount of SOC variation may be updated at the end of a rest state by the controller 120.

For example, the controller 120 may update the amount of SOC variation at the end (e.g., the key-on time point) of the first rest state 311. In addition, the controller 120 may also update the amount of SOC variation at the end (e.g., the BMS-on time point) of the second rest state 313. However, this is an example, and depending on the design, the amount of SOC variation may be updated in real time or at different time points.

According to the present embodiment, the controller 120 may check the balancing amount of the battery pack 200 when the battery pack 200 is in the second state (S82). As described above, in the present disclosure, the "second state" may correspond to an operation state of the battery pack 200. For example, the second state may refer to a state in which the battery pack 200 is being charged or is discharging. As described above, in the present disclosure, the first state and the second state may be opposite states.

In the present disclosure, the "balancing amount" may refer to the degree of balancing that is performed for a given period of time. The balancing amount may be proportional to, for example, the period of time during which balancing is performed. The balancing amount may be checked by the BMS of the battery pack 200, and may be transmitted to the battery-pack-internal-short-circuit-diagnosis apparatus 100.

Figure 6A:
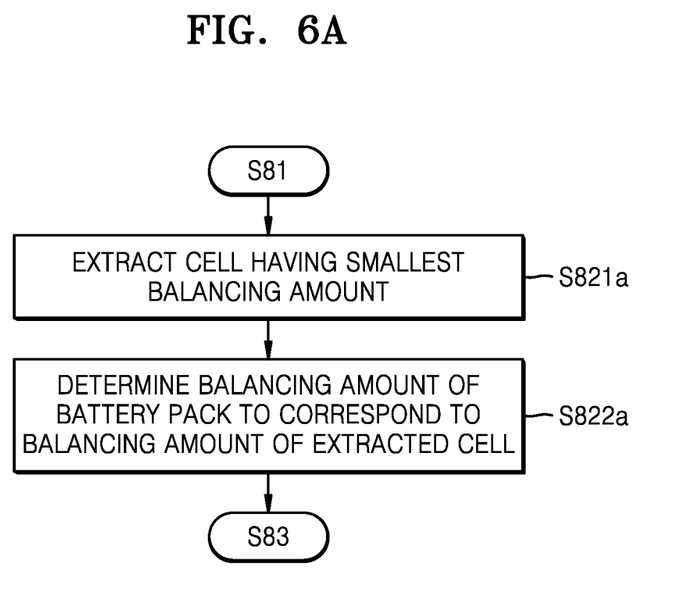

According to the present embodiment, the controller 120 may select one cell having the smallest balancing amount from at least two cells included in the battery pack 200 when the battery pack 200 is in the second state (S821a). In addition, the controller 120 may determine the balancing amount of the battery pack 200 to correspond to the balancing amount of the selected cell (S822a).

Figure 6B:
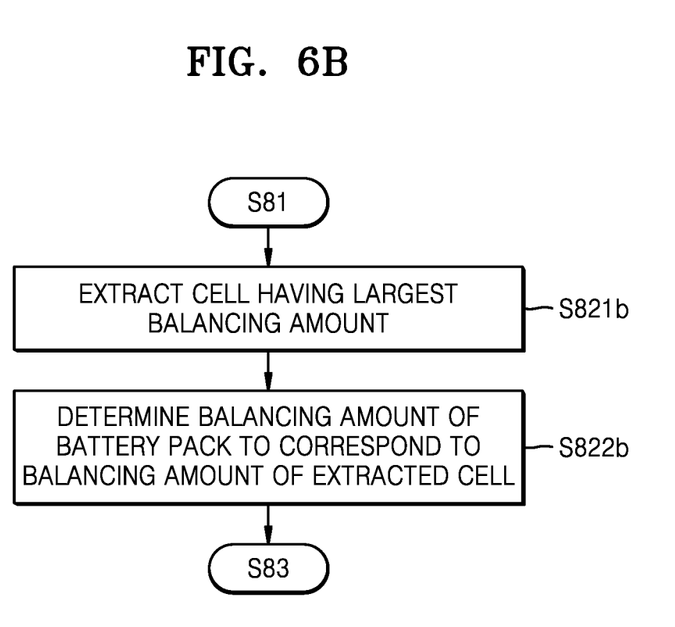

Conversely, according to the present embodiment, the controller 120 may select one cell that has the largest balancing amount from at least two cells included in the battery pack 200 when the battery pack 200 is in the second state (S821b). In addition, the controller 120 may determine the balancing amount of the battery pack 200 to correspond to the balancing amount of the selected cell (S822b).

According to the present embodiment, the controller 120 may determine the balancing amount of the battery pack 200 to correspond to the difference between the balancing amount of the selected cell and the average of the balancing amounts of the at least two cells.

As described above, according to the present embodiment, the controller 120 may determine the balancing amount of the battery pack 200 and/or the balancing amounts of the cells of the battery pack 200 by using various methods.

A method of determining a balancing amount by the controller 120 will now be described according to an embodiment while referring back to FIG. 3. As described above, according to the present embodiment, the controller 120 may check the balancing amount of the battery pack 200 when the battery pack 200 is in the second state, and the second state may correspond to the operation state 412 or the charging state 414 of the battery pack 200.

In addition, according to the present embodiment, the controller 120 may select one cell that has the smallest (or largest) balancing amount from at least two cells of the battery pack 200 when the battery pack 200 is in the second state, and then the controller 120 may determine the balancing amount of the battery pack 200 to correspond to the balancing amount of the selected cell. In FIG. 3, the selected cell is indicated as a "short circuited cell," and the other cells are indicated as normal cells.

According to the present embodiment, the controller 120 may check the sum of the balancing amount of the battery pack 200 in the operation state 412 and the balancing amount of the battery pack 200 in the charging state 414. In other words, according to the present embodiment, the controller 120 may accumulatively check the balancing amount of the battery pack 200 in the second state.

An accumulated balancing amount may be used to check whether the battery pack 200 and/or a corresponding cell have an internal short circuit, and this will be described below.

In addition, as described above, because the "amount of balancing" may be proportional to the period of time during which balancing is performed, the controller 120 may update the amount of balancing in real time over time. For example, in the operation state 412, the controller 120 may increase the amount of balancing over time. In addition, the controller 120 may increase the amount of balancing over time in the charging state 414. This may be based on that the balancing amount of a cell selected by the controller 120 is largest. However, this is an example, and the idea of the present disclosure is not limited thereto.

According to the present embodiment, the controller 120 may calculate a first time period and a second time period to detect an internal short circuit more accurately (S83). In this case, the first time period may refer to the sum of all time periods during which the battery pack 200 is in the first state, and the second time period may refer to the sum of all time periods during which the battery pack 200 is in the second state.

Based on the amount of SOC variation and the amount of balancing that have been checked through the above-described operations, the controller 120 of the present embodiment may determine whether the battery pack 200 has an internal short circuit (S84).

Referring back to FIG. 2, when the amount of SOC variation that is accumulated for a given period time is equal to or greater than a threshold value, the controller 120 of the present embodiment may determine that a corresponding cell and/or the battery pack 200 are internally short circuited. In other words, the controller 120 may determine that an internal short circuit has occurred in the corresponding cell and/or the battery pack 200 in a "short circuit detected period" in which the accumulated amount of variation in SOC is equal to or greater than the threshold value.

Similarly, referring to FIG. 3, when the amount of balancing which is accumulated for a given period of time is equal to or greater than (or equal to or less than) a threshold value, the controller 120 of the present embodiment may determine that a corresponding cell and/or the battery pack 200 are internally short circuited. Similarly, referring to FIG. 3, when the amount of balancing that is accumulated for a given period of time is equal to or greater than (or equal to or less than) a threshold value, the controller 120 of the present embodiment may determine that a corresponding cell and/or the battery pack 200 are internally short circuited.

In some embodiments, when the sum of a first value, which is obtained by multiplying a checked SOC variation amount by a first time period, and a second value, which is obtained by multiplying a checked balancing amount by a second time period, is greater than a threshold value, the controller 120 of the present embodiment may determine that the battery pack 200 has an internal short circuit. In this case, the first time period may refer to the sum of all time periods during which the battery pack 200 is in the first state, the second time period may refer to the sum of all time periods during which the battery pack 200 is in the second state, and the first time period and the second time period may be calculated by the controller 120.

Alternatively, when the sum of a first value, obtained by multiplying a checked SOC variation amount by the ratio of the first time period to the sum of the first and second time periods, and a second value, obtained by multiplying a checked balancing amount by the ratio of the second time period to the sum of the first and second time periods, is greater than a preset normalized threshold value, the controller 120 of the present embodiment may determine that the battery pack 200 has an internal short circuit. In this case, the first and second time periods are defined as described above.

As described above, according to the present disclosure, whether the battery pack 200 has an internal short circuit may be determined by considering both the rest state and the operation state of the battery pack 200, and the determination may be more reliably performed by considering the time period of each state.

In addition, according to the present disclosure, the occurrence of an internal short circuit may be more reliably determined by detecting the occurrence of abnormality in two different states by using methods respectively suitable for the two different states, and using results of the determination in a complementary manner.

According to the present embodiment, the controller 120 may perform the above-described operations repeatedly by initializing an accumulated SOC variation amount and an accumulated balancing amount at given time internals. For example, at intervals of 3000 seconds, the controller 120 may accumulate the amount of SOC variation and the amount of balancing, and may compare the accumulated SOC variation amount and the accumulated balancing amount respectively with threshold values to determine whether the battery pack 200 has an internal short circuit. In this case, when it is determined that an abnormality has occurred, the controller 120 may take an action (for example, alarming or the like) according to the abnormality. In case of no abnormality, the controller 120 may initialize the accumulated SOC variation amount and the accumulated balancing amount (for example, initializing to zero) and may then repeat the above-described operations.

According to various embodiments, an internal short circuit of a battery pack including a plurality of cells may be more accurately determined.

For example, whether a battery pack has an internal short circuit may be determined by considering both the rest state and the operation state of the battery pack, and the determination may be more reliably performed by considering the time period of each state.

In addition, the occurrence of an internal short circuit may be more reliably determined by detecting the occurrence of abnormality in two different states by using methods respectively suitable for the two different states, and by using results of the determination in a complementary manner.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with equivalents thereof to be included therein.

What is claimed is:

1. A method of diagnosing an internal short circuit of a battery pack, based on a state of charge (SOC) variation amount and a balancing amount of each cell of the battery pack, the method comprising:

checking an SOC variation amount of the battery pack when the battery pack is in a first state;

checking a balancing amount of the battery pack, the balancing amount corresponding to a degree of balancing that is performed for a given period of time, or corresponding to an amount of charge consumed for balancing purposes, when the battery pack is in a second state;

determining whether the battery pack has an internal short circuit based on the checked SOC variation amount and the checked balancing amount; and prior to the determining of whether the battery pack has an internal short circuit, calculating a first time period, which is a sum of all time periods during which the battery pack is in the first state, and a second time period, which is a sum of all time periods during which the battery pack is in the second state.

2. The method of claim 1, wherein the first state corresponds to a rest state of the battery pack.

3. The method of claim 2, wherein the checking of the SOC variation amount of the battery pack comprises:

selecting a cell from one or more cells in the battery pack, the selected cell having a largest SOC variation amount when the battery pack is in the first state; and determining the SOC variation amount of the battery pack to correspond to the SOC variation amount of the selected cell.

4. The method of claim 3, wherein the SOC variation amount of the battery pack corresponds to a difference between the SOC variation amount of the selected cell and an average of SOC variation amounts of the one or more cells.

5. The method of claim 1, wherein the second state corresponds to an operation state of the battery pack.

6. The method of claim 5, wherein the checking of the balancing amount of the battery pack comprises:

selecting a cell from at least two cells in the battery pack, the selected cell having a smallest balancing amount when the battery pack is in the second state; and determining the balancing amount of the battery pack to correspond to the balancing amount of the selected cell.

7. The method of claim 6, wherein the balancing amount of the battery pack corresponds to a difference between the balancing amount of the selected cell and an average of balancing amounts of the at least two cells.

8. The method of claim 5, wherein the checking of the balancing amount of the battery pack comprises:

selecting a cell from at least two cells in the battery pack, the selected cell having a largest balancing amount when the battery pack is in the second state; and determining the balancing amount of the battery pack to correspond to the balancing amount of the selected cell.

9. The method of claim 1, further comprising determining the battery pack as having an internal short circuit when a sum of a first value obtained by multiplying the checked SOC variation amount by the first time period and a second value obtained by multiplying the checked balancing amount by the second time period is greater than a threshold value.

10. A computer program stored on a non-transitory medium for executing the method of claim 1 using a computer.

11. An apparatus for diagnosing an internal short circuit of a battery pack based on an SOC variation amount and a balancing amount of each cell of the battery pack, the apparatus comprising a controller that is configured to:

check an SOC variation amount of the battery pack when the battery pack is in a first state;

check a balancing amount of the battery pack when the battery pack is in a second state;

determine, based on the checked SOC variation amount and the checked balancing amount, whether the battery pack has an internal short circuit; and calculate a first time period, which is a sum of all time periods during which the battery pack is in the first state, and a second time period, which is a sum of all time periods during which the battery pack is in the second state.

12. The apparatus of claim 11, wherein the second state corresponds to an operation state of the battery pack, and wherein the controller is further configured to:

select a cell from at least two cells in the battery pack, the selected cell having a smallest balancing amount when the battery pack is in the second state; and determine the balancing amount of the battery pack to correspond to the balancing amount of the selected cell.

13. The apparatus of claim 12, wherein the controller is further configured to determine the balancing amount of the battery pack to correspond to a difference between the balancing amount of the selected cell and an average of balancing amounts of the at least two cells.

14. The apparatus of claim 11, wherein the second state corresponds to an operation state of the battery pack, and wherein the controller is further configured to:

select a cell from at least two cells in the battery pack, the selected cell having a largest balancing amount when the battery pack is in the second state; and determine the balancing amount of the battery pack to correspond to the balancing amount of the selected cell.

15. The apparatus of claim 12, wherein the controller is further configured to determine that the battery pack has an internal short circuit when a sum of a first value obtained by multiplying the checked SOC variation amount by the first time period and a second value obtained by multiplying the checked balancing amount by the second time period is greater than a threshold value.

16. An apparatus for diagnosing an internal short circuit of a battery pack based on an SOC variation amount and a balancing amount of each cell of the battery pack, the apparatus comprising a controller that is configured to:

check an SOC variation amount of the battery pack when the battery pack is in a first state;

check a balancing amount of the battery pack when the battery pack is in a second state; and determine, based on the checked SOC variation amount and the checked balancing amount, whether the battery pack has an internal short circuit, wherein the first state corresponds to a rest state of the battery pack, and wherein the controller is further configured to:

select one cell from one or more cells in the battery pack, the one cell having a largest SOC variation amount when the battery pack is in the first state; and determine the SOC variation amount of the battery pack to correspond to the SOC variation amount of the selected cell.

17. The apparatus of claim 16, wherein the controller is further configured to determine the SOC variation amount of the battery pack to correspond to a difference between the SOC variation amount of the selected cell and an average of SOC variation amounts of the one or more cells.

* * * * *

UNITED STATES PATENT AND TRADEMARK OFFICE
CERTIFICATE OF CORRECTION

| | |
|---|---|
| PATENT NO. | : 11,513,162 B2 |
| APPLICATION NO. | : 16/548627 |
| DATED | : November 29, 2022 |
| INVENTOR(S) | : Changyoon Chun et al. |

It is certified that error appears in the above-identified patent and that said Letters Patent is hereby corrected as shown below:

In the Claims

In Column 18, Line 34, in Claim 15, delete "claim 12," and insert -- claim 11, --.

Signed and Sealed this
Twenty-first Day of November, 2023

Katherine Kelly Vidal
*Director of the United States Patent and Trademark Office*